United States Patent [19]

Murakami et al.

[11] Patent Number: 4,521,682
[45] Date of Patent: Jun. 4, 1985

[54] PHOTODETECTING DEVICE HAVING JOSEPHSON JUNCTIONS

[75] Inventors: Toshiaki Murakami; Yoichi Enomoto; Takahiro Inamura, all of Mito, Japan

[73] Assignee: Nippon Telegraph & Telephone Public Corporation, Tokyo, Japan

[21] Appl. No.: 607,509

[22] Filed: May 7, 1984

[30] Foreign Application Priority Data

May 14, 1983 [JP] Japan .................................. 58-84845

[51] Int. Cl.$^3$ ............................................ H01L 39/22
[52] U.S. Cl. .................................... 250/211 J; 357/5; 250/208
[58] Field of Search ................. 250/211 J, 208; 357/5, 357/6; 324/71.1

[56] References Cited
U.S. PATENT DOCUMENTS 4,316,785 2/1982 Suzuki et al. ............................ 357/5

Primary Examiner—John D. Welsh
Attorney, Agent, or Firm—Frishauf, Holtz, Goodman & Woodward

[57] ABSTRACT

A photodetecting device having Josephson junctions, comprises an insulating substrate, a polycrystalline superconductor film formed on the insulating substrate such that Josephson junctions are formed at grain boundaries, the superconductor film having a first region subjected to light illumination, and second and third regions formed contiguously at both sides of the first region such that a width of each of the second and third regions is wider than that of the first region, an input circuit for supplying a predetermined bias current between the second and third regions, and an output circuit for detecting a change in voltage between the second and third regions, one terminal of said input circuit and one terminal of said output circuit being commonly grounded, wherein the superconductor film comprises $BaPb_{1-x}Bi_xO_3$ (where $0.32 \leq x \leq 0.35$). This simple photodetecting device can detect an optical signal at high speed with high sensitivity.

2 Claims, 12 Drawing Figures

F I G. 3
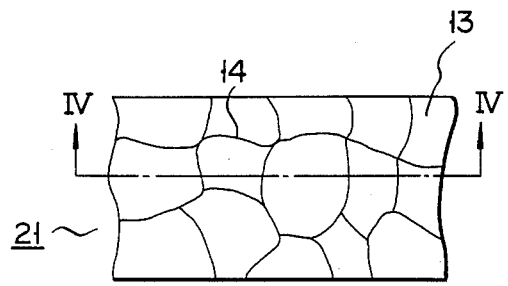
F I G. 4
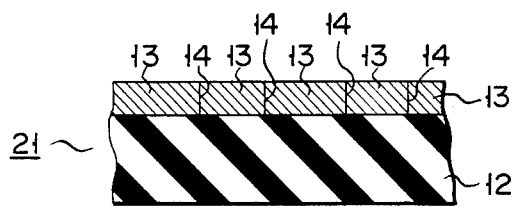
F I G. 5
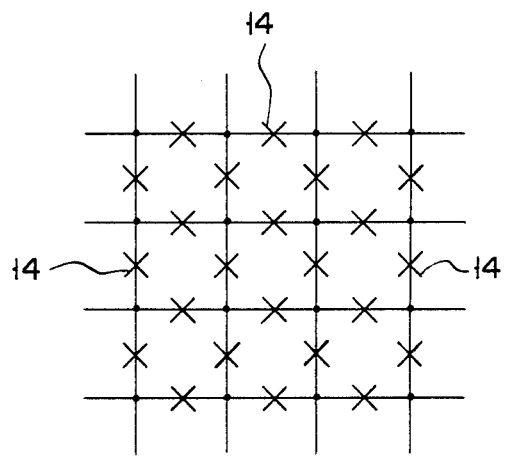

PHOTODETECTING DEVICE HAVING JOSEPHSON JUNCTIONS

BACKGROUND OF THE INVENTION

The present invention relates to a photodetecting device and, more particularly, to a photodetecting device having a polycrystalline superconductor film which has Josephson junctions at its grain boundaries. A photodetecting device utilizing Josephson junctions shown in FIG. 1 was described by Enomoto et al in a lecture article issued by the Institute of Electronics and Communication Engineers of Japan.

Referring to FIG. 1, reference numeral 1 denotes a cross-shaped oxide superconductor pattern of $BaPb_{0.7}Bi_{0.3}O_3$ formed on a sapphire substrate 2 and having a thickness of 300 nm. The pattern 1 comprises a region 3, which is irradiated with light and located at the center of the pattern, a pair of input regions 4 and 4' extending from the region 3 to the left and right, and a pair of output regions 5 and 5' extending from the region 3 in the upper and lower directions. An input circuit (not shown) is connected to the input regions 4 and 4' to cause a DC bias current to flow thereto. An output circuit (not shown) including a differential amplifier for measuring changes in voltages generated between the output regions 5 and 5' is connected to the output regions 5 and 5'.

In the photodetecting device having the arrangement described above, when light irradiates the region 3 from an illuminating means (not shown) while a predetermined DC current flows from the input circuit to the pair of input regions 4 and 4', a change in voltage between the output regions 5 and 5' occurs. This voltage change is measured by the output circuit. In this manner, light can be detected. In general, the Josephson junctions require an electromagnetic shield and sufficient ground means to eliminate induction noise caused by background electromagnetic waves other than the target signal, since the Josephson junctions have high electromagnetic sensitivity.

However, in the photodetecting device shown in FIG. 1, the input and output circuits are independently arranged, so common ground is not present between the input and output circuits. Thus, it is difficult to decrease the induction noise level to a target level.

SUMMARY OF THE INVENTION

It is an object of the present invention to provide a photodetecting device having Josephson junctions and a simple construction, that allows highly sensitive detection of an optical signal, and can reduce background noise.

In order to achieve the above object of the present invention, there is provided a photodetecting device having Josephson junctions, comprising:
an insulating substrate;
a polycrystalline superconductor film formed on said insulating substrate such that Josephson junctions are formed at grain boundaries, said superconductor film having a first region subjected to light illumination, and second and third regions formed contiguously at both sides of said first region such that a width of each of said second and third regions is wider than that of said first region;
means for supplying a predtermined bias current between said second and third regions; and
means for detecting a change in voltage between said second and third regions, one terminal of said means for supplying and one terminal of said means for detecting being commonly grounded,
wherein said superconductor film comprises $BaPb_{1-x}Bi_xO_3$ (where $0.32 \leq x \leq 0.35$ The waveform of an optical signal effectively detected by the photodetecting device of the present invention falls within the range of 1 to 10 $\mu m$.

BRIEF DESCRIPTION OF THE DRAWINGS

FIG. 3 is an enlarged plan view showing part of the photodetecting device of the device shown in FIG. 2;

FIG. 4 is a cross-sectional view of the photodetecting device shown in FIG. 2 taken along the line IV—IV of FIG. 3;

FIG. 5 is an equivalent circuit diagram of the light irradiated region of the photodetecting device shown in FIG. 3;

DETAILED DESCRIPTION OF THE PREFERRED EMBODIMENTS

Figure 1:
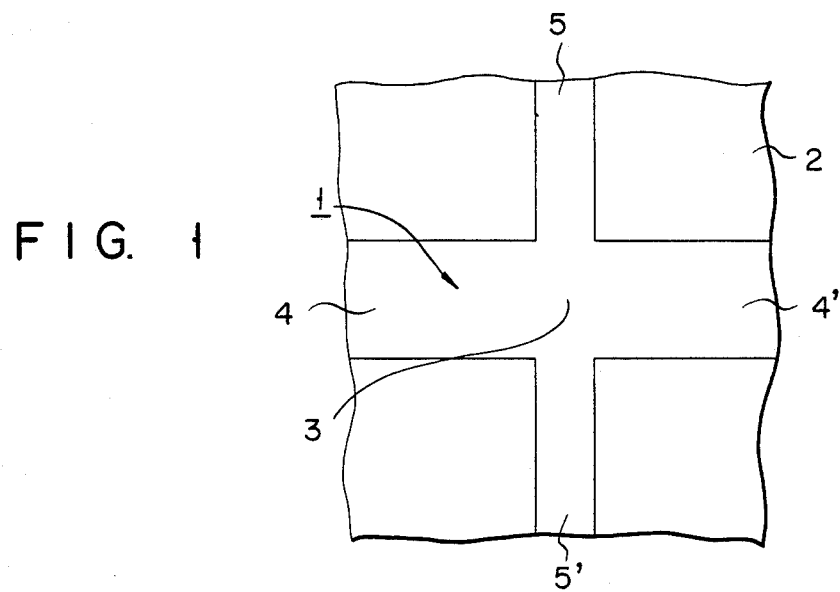
FIG. 1 is a schematic plan view of a conventional photodetecting device having Josephson junctions.

A photodetecting device having Josephson junctions according to an embodiment of the present invention will now be described with reference to FIG. 2.

Reference numeral 11 denotes a polycrystalline superconductor film of 2,000 to 4,000 Å thickness formed on a substrate 12 made of an insulating material such as sapphire. The superconductor film 11 comprises a region 21 having a width of 50 $\mu m$, which is irradiated with light, and electrode regions 22A and 22B which respectively have a larger width than that of the region 21 and which extend therefrom in the opposite directions with respect to each other.

FIG. 3 is an enlarged plan view showing part of the region 21, and FIG. 4 is a sectional view thereof along the line IV—IV of FIG. 3. As shown in FIGS. 3 and 4, Josephson junctions 14 are formed at grain boundaries 13 in the polycrystalline superconductor film 11. Therefore, the equivalent circuit of the Josephson junction 14 in the region 21, as shown in FIG. 5, has a matrix arrangement. An input circuit is connected between the electrode regions 22A and 22B to supply a predetermined bias current therethrough. This input circuit has a DC power supply 25 connected to contact films 23 and 24 which are respectively formed by deposition of gold on the electrode regions 22A and 22B. A node between the negative terminal of the DC power supply 25 and the contact film 24 is grounded. On the other hand, an output circuit (e.g., voltage detector 26) is connected to the electrode regions 22A and 22B. Reference numeral 27 denotes a contact film formed by deposition of gold on the electrode region 22A. One terminal of the voltage detector 26 is connected to the contact film 27, and the other terminal of the voltage detector 26 is connected to the contact film 24. The influences such a noise given by the bias current to the voltage detector 26 are suppressed by separating the contact film 23 and the contact film 27 from each other on the electrode region 22A.

In the arrangement described above, the device is kept at constant current bias. When light irradiates the region 21 from a light irradiating means (not shown) such as an optical fiber, quasiparticles are created in the region 21 and change the superconductor energey gap (2Δ). The energy gap change causes, through the output, a voltage change of the Josephson junctions. Therefore, light is detected by measuring the change of the output voltage. In addition, the contact film 24 is formed on the electrode region 22B and is commonly used for the input and output circuits. Therefore, the input and output circuits commonly use on ground. As a result, the induction noise in the input and output circuits can be easily decreased by a simple construction.

The width of the light radiation region 21 of the superconductor film 11 is smaller than that of each of the electrode regions 22A and 22B. When a bias current flows, the particular construction permits the current density in only the region 21 to be greater than the critical value so as to put the region 21 alone under a voltage state. With the current density the regions 22A, 22B hold below the critical value so as to keep the superconducting state in the regions 22A, 22B. Where the regions 22A, 22B are transformed into a voltage state, it is difficult to detect the change in the voltage under irradiation. It is sufficient for the regions 22A, 22B to be about 1.5 times as wide as the region 21, and an increased width of the regions 22A, 22B permits diminishing the inductance, leading to an improvement in the high frequency characteristics.

The polycrystalline superconductor film 11 formed at the crystal boundary comprises $BaPb_{1-x}Bi_xO_3$ (where $0.32 \leq X \leq 0.35$). The superconductor film 11 is formed by sputtering method. The superconductor film is annealed in an oxygen atmosphere, and the annealed film is patterned to obtain the above-mentioned polycrystalline superconductor film 11.

For example, a $Ba(Pb_{0.68}Bi_{0.32})_{1.5}O_4$ ceramic plate was used as a target, and an insulating substate 12 was heated at a temperature of 260° C. in an atmosphere (pressure of $5 \times 10^{-3}$ Torr) of a gas mixture (ratio of 50:50) of argon and oxygen, and a plate voltage was 1.5 kV. Under these conditions, a thin $BaPb_{0.68}Bi_{0.32}O_3$ film was formed by magnetron sputtering on the insulating substrate 12. The insulating substrate 12 having the thin film described above was placed in an alumina vessel together with PbO or $Pb_3O_4$ powder and was annealed in an oxygen atmosphere at a temperature of 505° C. for 12 hours. As a result, a polycrystalline supercondutor film of $BaPb_{1-x}Bi_xO_3$ (where $0.32 \leq X \leq 0.35$) was formed on the insulating substrate 12. Subsequently, the resultant polycrystalline superconductor film was etched by an etchant using an aqueous solution containing 30% $HClO_4$ and 0.5% HCl. The transition point of the resultant polycrystalline superconductor film 11 was about 9° K.

Figure 6:
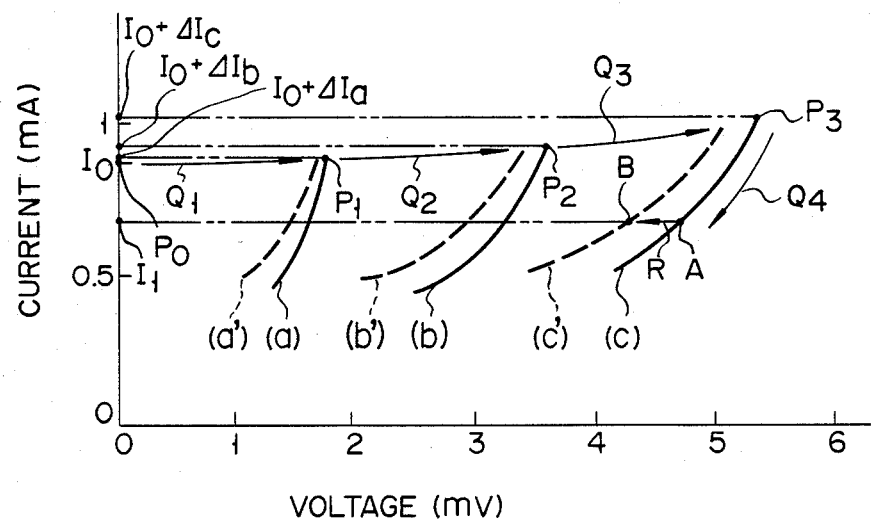
FIG. 6 is a graph showing the I-V characteristic curves in electrode regions 22A and 22B when light irradiates and does not irradiate a region 21 of the photodetecting device shown in FIG. 2.

According to the photodetecting device having the Josephson junctions described above, when light does not irradiate the light radiation region, the I-V characteristic curve obtained across the electrode regions 22A and 22B is indicated by the solid line in FIG. 6.

FIG. 6 shows that, under a bias current $I_b$ which is slightly higher than the critical current $I_o$, i.e., $I_b = I_o + \Delta I_a$, a transformation occurs from a superconducting state $P_o$ to a first voltage state $P_1$ (See an arrow $Q_1$). If the bias current $I_b$ is further increased to $I_o + \Delta I_b$ ($\Delta I_b > \Delta I_a$), the first voltage state $P_1$ is transformed into a second voltage state $P_2$ as denoted by an arrow $Q_2$. A further increase of the bias current $I_b$ to $I_o + \Delta I_c$ ($\Delta I_c > \Delta I_b$) brings about a transformation of the second voltage state $P_2$ into a third voltage state $P_3$ as denoted by an arrow $Q_3$. If the bias current $I_b$ is further changed to $I_1$ ($-I_o < I_1 < I_o$), the voltage is dropped to a point A along a solid line (c) as denoted by an arrow $Q_4$. If the region 21 is irradiated with the bias current $I_b$ kept at $I_1$, the voltage is changed from the value of the point A to the value at a point B in accordance with the load. In this case, even if the light is of a small intensity, even as small as several nanowatts, the I-V characteristic curve in the electrode regions 22A and 22B is displaced along the V-axis from the solid characteristic curve (c) to the dotted curve (c').

Where the initial bias current $I_b$ is set at $I_o + \Delta I_b$, i.e., $I_b = I_o + \Delta I_b$, a change of voltage from the solid curve (b) to the dotted curve (b') is observed by the similar operation.

Figure 2:
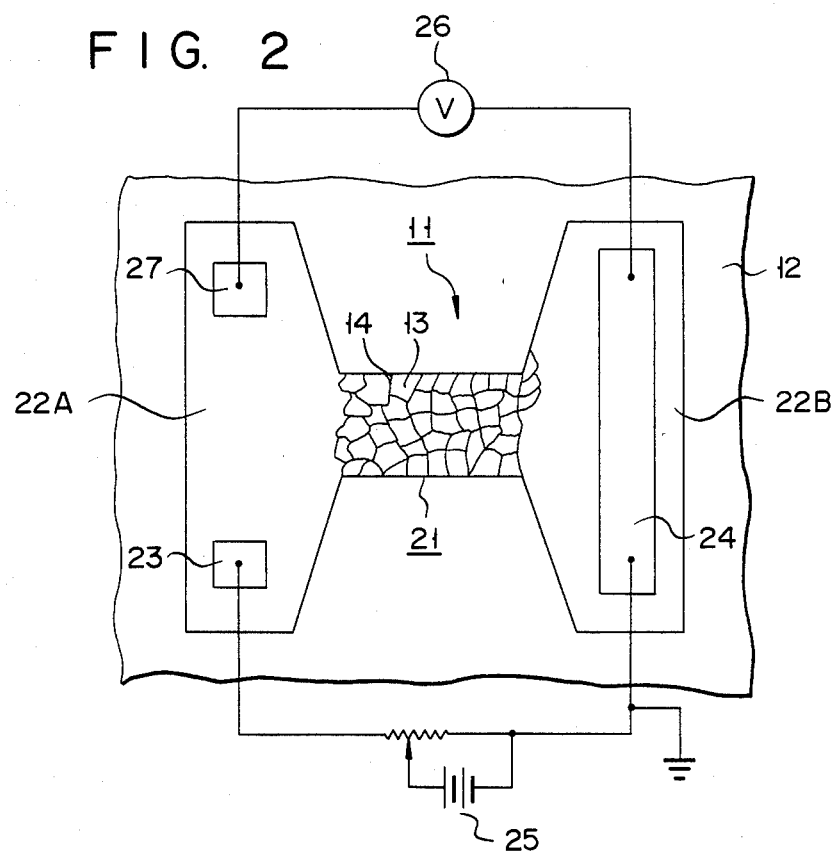
FIG. 2 is a schematic plan view of a photodetecting device having Josephson junctions according to an embodiment of the present invention.

According to the photodetecting device having the Josephson junction shown in FIG. 2, light can be detected whether or not the predetermined voltage is generated across the electrode regions 22A and 22B, thereby providing the function of the photodetecting device.

In particular, the solid I-V characteristic curve (a), (b) or (c) in FIG. 6 of the electrode regions 22A and 22B which is obtained while no light irradiates the region 21 is changed to the dotted I-V characteristic curve (a'), (b') or (c') in FIG. 6 when light irradiates the region 21. In other words, the characteristic curve is shifted along the V-axis. By detecting the change in the I-V characteristic curve, light can be detected.

Therefore, the photodetecting device having the Josephson junctions shown in FIG. 2, provides a sensitive photodetecting device.

Figure 7:
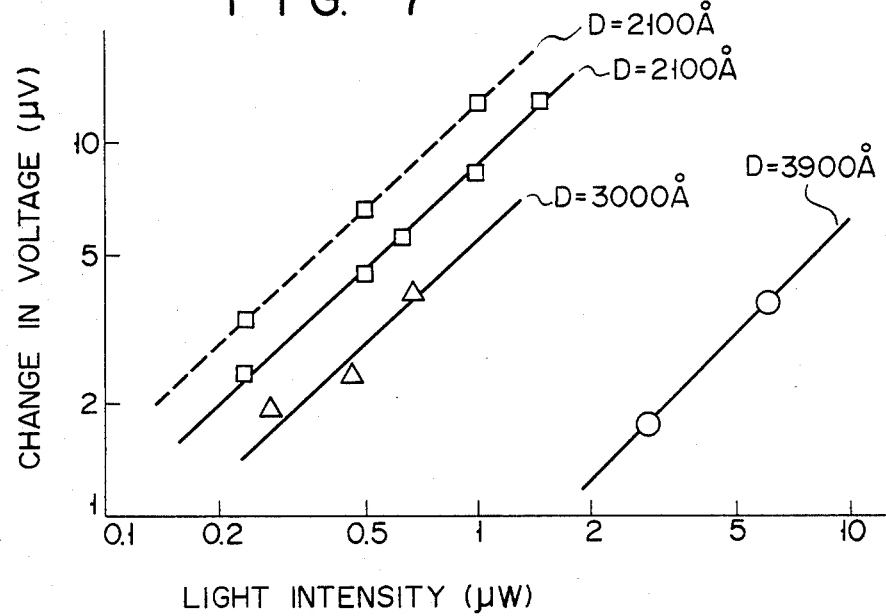
FIG. 7 is a graph showing the measured results of changes ($\mu V$) in voltages as a function of the light intensity ($\mu W$) when a thickness D (Å) of a polycrystalline superconductor film of the photodetecting device shown in FIG. 2 is used as a parameter.
Figure 8:
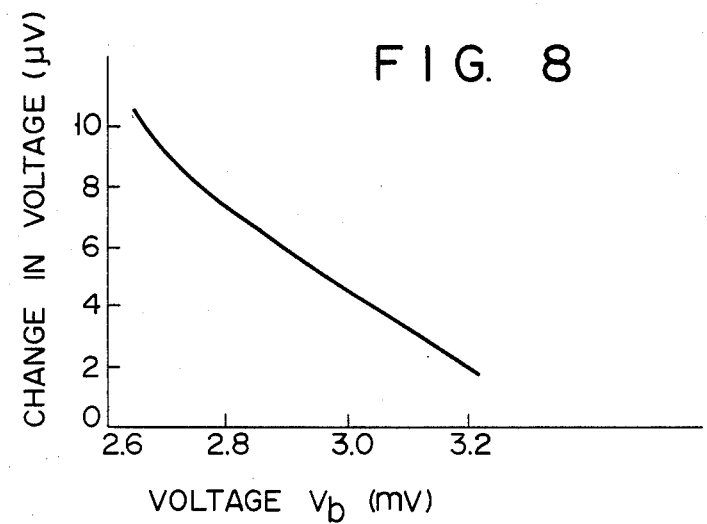
FIG. 8 is a graph showing the measured results of changes ($\mu V$) in voltages as a function of the voltage Vb corresponding to the bias current within the range of critical current value in the photodetecting device shown in FIG. 2.
Figure 9:
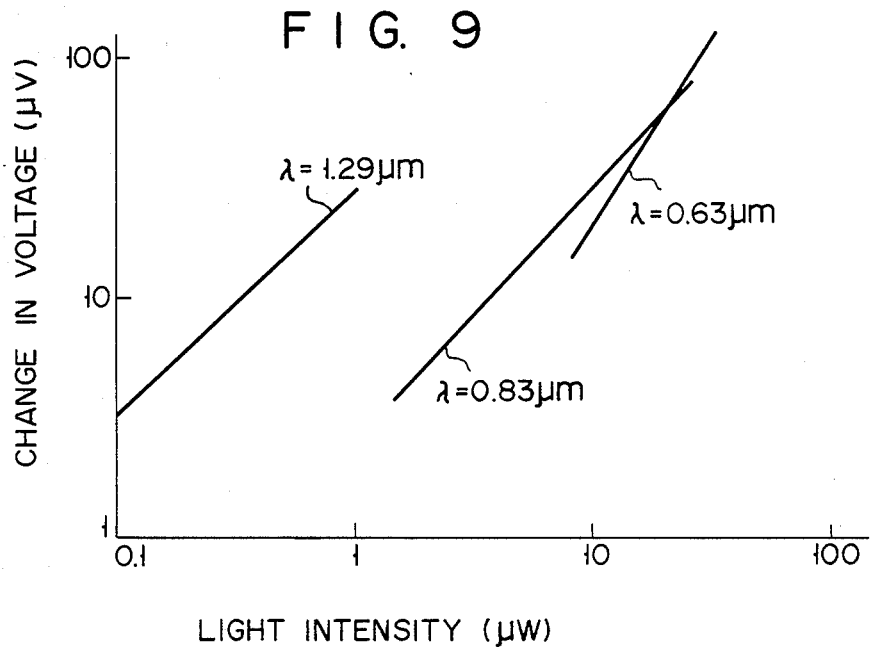
FIGS. 9 and 10 are graphs showing the measured results of changes ($\mu V$) in voltage as a function of light intensity ($\mu W$) in the photodetecting device shown in FIG. 2 when the waveform $\lambda$ ($\mu m$) and the voltage Vb corresponding to the bias current within the range of critical current value are used as parameters, respectively.
Figure 10:
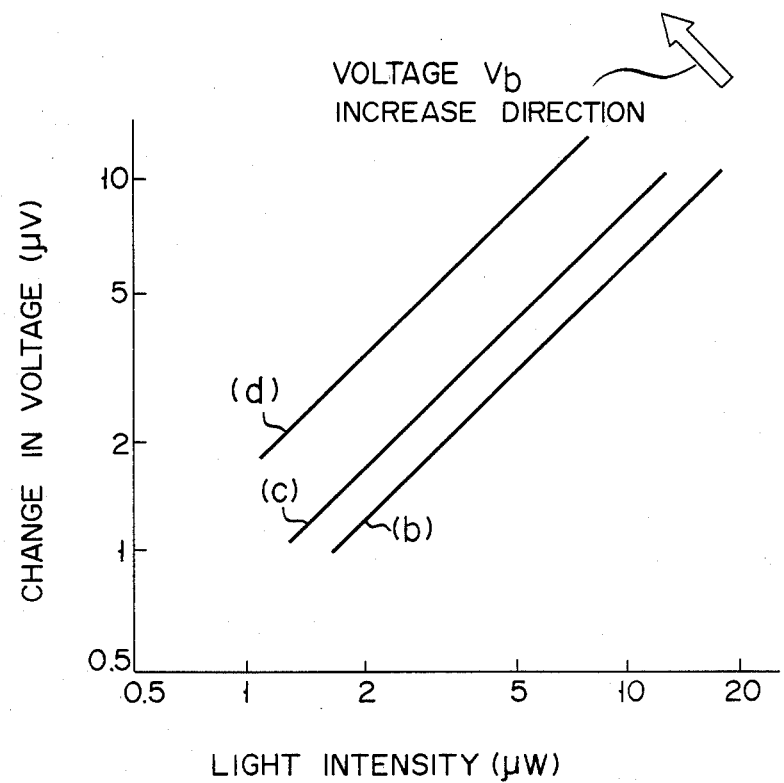
Figure 11:
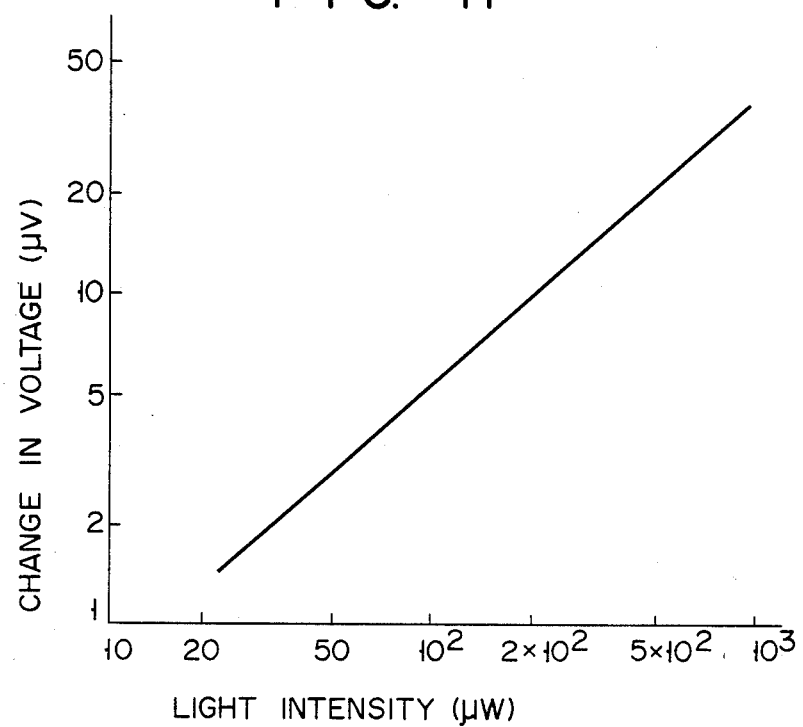
FIG. 11 is a graph showing the measured results of changes ($\mu V$) in voltages as a function of the amount of light intensity ($\mu W$) in the photodetecting device in FIG. 2.

FIG. 7 shows the change ($\mu V$) in voltage between the electrode regions 22A and 22B when the thickness D (Å) of the polycrystalline superconductor film 11 is used as a parameter and the voltage Vb corresponding to the bias current within the range of critical current value is given to be 3 mV. FIG. 8 shows the change (μV) in voltage between the electrode regions 22A and 22B as a function of the voltage Vb corresponding to the bias current within the range of critical current value when the polycrystalline superconductor film 11 has a thickness of 3,000 Å and light having a wavelength of 1.29 μm irradiates the region 21. FIG. 9 shows the change (μV) in voltage between the electrode regions 22A and 22B as a function of the light intensity (μW) when the polycrystalline superconductor film 11 has a thickness of 3,000 Å, the wavelength of light is used as a parameter and the voltage Vb corresponding to the bias current within the range of critical current value is set at 3 mV. FIG. 10 shows the change (μV) in voltage between the electrode regions 22A and 22B as a function of the light intensity (μW) when the polycrystalline superconductor film 11 has a thickness of 3,000 Å. Lines (b), (c) and (d) shown in FIG. 10 denote the changes in voltage under the second voltage state (which corresponds to the curves (b), (b') of FIG. 6), the third voltage state (which corresponds to the curves (c), (c') of FIG. 6) and the fourth voltage state (which is not included in FIG. 6), respectively. The graph of FIG. 10 is based on the condition that the bias current is 0.7 mA. FIG. 11 shows the change (μV) in voltage between the regions 22A and 22B as a function of the light intensity (μW) when the voltage Vb corresponding to the bias current within the range of critical current value is set at 3 mV.

It should be noted that the polycrystalline superconductor film 11 comprises $BaPb_{0.68}Bi_{0.32}O_3$ having the transition point of 9° K. for the results shown in FIGS. 8 to 10, and that the polycrystalline superconductor film 11 has a thickness of 3,000 Å and comprises $BaPb_{0.66}Bi_{0.34}O_3$ having a transition point of 6° K. for the result in FIG. 11.

Figure 12:
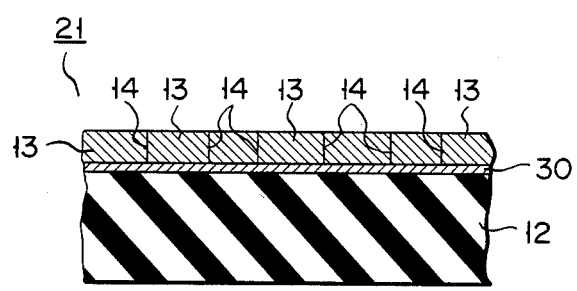
FIG. 12 is a sectional view of a photodetecting device according to another embodiment of the present invention.

The photodetecting device shown in FIG. 12 is substantially the same as that shown in FIGS. 2, 3 and 4 except that a reflecting film 30 is formed between a superconductor film 11 and a substrate 12. The reflecting film 30 serves to prevent light from being transmitted to the substrate 12 through the superconductor film 11. As a result, the light detecting sensitivity of the photodetecting device can be further improved. The reflecting film 30 may comprise a metal layer made of silver, platinum or the like and formed on the substrate 12, and a thin insulating layer for short-circuit prevention. It should be noted that the same reference numerals used in FIG. 12 denote the same parts as in FIG. 4.

The present invention utilizes a polycrystalline superconductor having a semiconductor like nature such as $BaPb_{1-x}Bi_xO_3$ ($0.32 \leq x \leq 0.35$). Unlike the conventional metal superconductor, the polycrystalline superconductor used in the present invention readily permits light to permeates thereinto. Also, a mesh-like Josephson junction formed at the boundary of the crystal grains of the superconductor thin film is utilized for detecting the change of energy gap in the present invention. The use of the polycrystalline superconductor permits markedly improving the sensitivity to light having a wavelength of 0.8 to 10 μm. Also, the change of voltage is markedly increased by the adding effect at the point where the Josephson junctions are connected in series, making it possible to obtain a photodetecting device of a very high sensitivity. What should also be noted is that the bias current supply means and the voltage detecting means can be commonly connected to the ground in the present invention, making it possible to provide a photodetecting device strong against noises.

What is claimed is:

1. A photodetecting device having Josephson junctions, comprising:
   an insulating substrate;
   a polycrystalline superconductor film formed on said insulating substrate such that Josephson junctions are formed at grain boundaries, said superconductor film having a first region subjected to light illumination, and second and third regions formed contiguously at both sides of said first region such that a width of each of said second and third regions is wider than that of said first region;
   means for supplying a predetermined bias current between said second and third regions; and
   means for detecting a change in voltage between said second and third regions, one terminal of said means for supplying and one terminal of said means for detecting being commonly grounded,
   wherein said superconductor film comprises $BaPb_{1-x}Bi_xO_3$ (where $0.32 \leq x \leq 0.35$).

2. A device according to claim 1, wherein a light-reflecting layer is formed between said substrate and said superconductor film.

* * * * *